(12) United States Patent
Dick

(10) Patent No.: US 9,014,241 B2
(45) Date of Patent: Apr. 21, 2015

(54) DIGITAL PRE-DISTORTION IN A COMMUNICATION NETWORK

(71) Applicant: Xilinx, Inc., San Jose, CA (US)

(72) Inventor: Christopher H. Dick, San Jose, CA (US)

(73) Assignee: Xilinx, Inc., San Jose, CA (US)

(*) Notice: Subject to any disclaimer, the term of this patent is extended or adjusted under 35 U.S.C. 154(b) by 121 days.

(21) Appl. No.: 13/674,867

(22) Filed: Nov. 12, 2012

(65) Prior Publication Data

US 2014/0133527 A1    May 15, 2014

(51) Int. Cl.
*H04B 1/38* (2006.01)
*H04L 5/16* (2006.01)
*H04B 7/005* (2006.01)
*H03F 1/32* (2006.01)
*H03F 3/189* (2006.01)
*H03F 3/24* (2006.01)

(52) U.S. Cl.
CPC .............. *H04B 7/005* (2013.01); *H03F 1/3247* (2013.01); *H03F 3/189* (2013.01); *H03F 3/245* (2013.01); *H03F 2201/3212* (2013.01); *H03F 2201/3233* (2013.01)

(58) Field of Classification Search
USPC .......................................................... 375/219
See application file for complete search history.

(56) References Cited

U.S. PATENT DOCUMENTS

| | | | | |
|---|---|---|---|---|
| 5,963,352 A | * | 10/1999 | Atlas et al. | 398/193 |
| 7,962,174 B2 | * | 6/2011 | Lipowski et al. | 455/561 |
| 8,140,106 B2 | * | 3/2012 | Chiba et al. | 455/522 |
| 8,229,025 B1 | | 7/2012 | Summerfield | |
| 2003/0179830 A1 | * | 9/2003 | Eidson et al. | 375/296 |
| 2003/0203717 A1 | * | 10/2003 | Chuprun et al. | 455/12.1 |
| 2006/0012426 A1 | | 1/2006 | Nezami | |
| 2007/0153884 A1 | | 7/2007 | Balasubramanian | |
| 2008/0049868 A1 | * | 2/2008 | Brobston | 375/297 |
| 2013/0063575 A1 | * | 3/2013 | Jia et al. | 348/51 |
| 2013/0243074 A1 | * | 9/2013 | Bai | 375/240 |

FOREIGN PATENT DOCUMENTS

EP    2117115 A1    11/2009
WO    WO 2010-124297 A1    10/2010

* cited by examiner

*Primary Examiner* — Erin File
(74) *Attorney, Agent, or Firm* — John J. King

(57) ABSTRACT

A method of performing digital pre-distortion in a communication network is described. The method comprises implementing a transceiver in the communication network, the transceiver enabling the transfer of communication signals in the communication network by way of a wireless communication channel; sampling signals, at the transceiver, associated with a transmit signal which are necessary to perform digital pre-distortion; providing the sampled signals to a remote computer; and generating, at the remote computer, parameters to be applied to a digital pre-distortion circuit of the transceiver. A communication network configured to enable digital pre-distortion is also described.

18 Claims, 7 Drawing Sheets

DIGITAL PRE-DISTORTION IN A COMMUNICATION NETWORK

FIELD OF THE INVENTION

One or more embodiments generally relate to communication networks, and more particularly to digital pre-distortion in a communication network.

BACKGROUND

One of the most costly sub-systems in a wireless communication device is the RF processing chain. The most costly component in the RF processing chain is the power amplifier. To reduce the cost of a transmitter, equipment manufacturers focus on using low-cost power amplifiers. However, low-cost power amplifiers are inherently non-linear. The waveforms of conventional wireless communication protocols that are to be processed by the power amplifier ideally require a linear transfer function to both minimize spectral emissions, via spectral re-growth mechanisms to a neighbor spectrum, and to also control the amount of in-band distortion that is generated by a non-linear transfer function.

Because the distortion mechanism at work in these systems, solutions based on the offline characterization of an amplifier and the employment of a look-up table are inadequate for the combination of bandwidths, modulation schemes and amplifier topologies that are used in current generation communications networks. However, improving linearity can be costly to implement. The algorithms employed in an adaptive processor are complicated and require significant computing requirements. Further, digital pre-distortion processing is often considered a technology that differentiates one equipment provider's base station from another. The ability to customize one's approach to digital pre-distortion is considered valuable. Accordingly, methods for improving linearity in a transmitter of a wireless communication network are desirable.

SUMMARY

A method of performing digital pre-distortion in a communication network is described. The method comprises implementing a transceiver in the communication network, the transceiver enabling the transfer of communication signals in the communication network by way of a wireless communication channel; sampling signals, at the transceiver, associated with a transmit signal which are necessary to perform digital pre-distortion; providing the sampled signals to a remote computer; and generating, at the remote computer, parameters to be applied to a digital pre-distortion circuit of the transceiver.

An embodiment of a communication device comprises a memory storing sampled signals associated with a transmit signal, wherein the sampled signals enable the calculation of digital pre-distortion parameters for signals transmitted in a communication network; and a processing circuit coupled to the memory, the processing circuit configured to transfer the sampled signals to a remote computer for generating the digital pre-distortion parameters.

Another embodiment of a communication device comprises an input for receiving sampled signals associated with a transmit signal generated by a transceiver; and a processing circuit coupled to the input, wherein the processing circuit is remote from the transceiver and is configured to calculate digital pre-distortion parameters to be applied to signals transmitted by the transceiver.

DETAILED DESCRIPTION OF THE DRAWINGS

Figure 1:
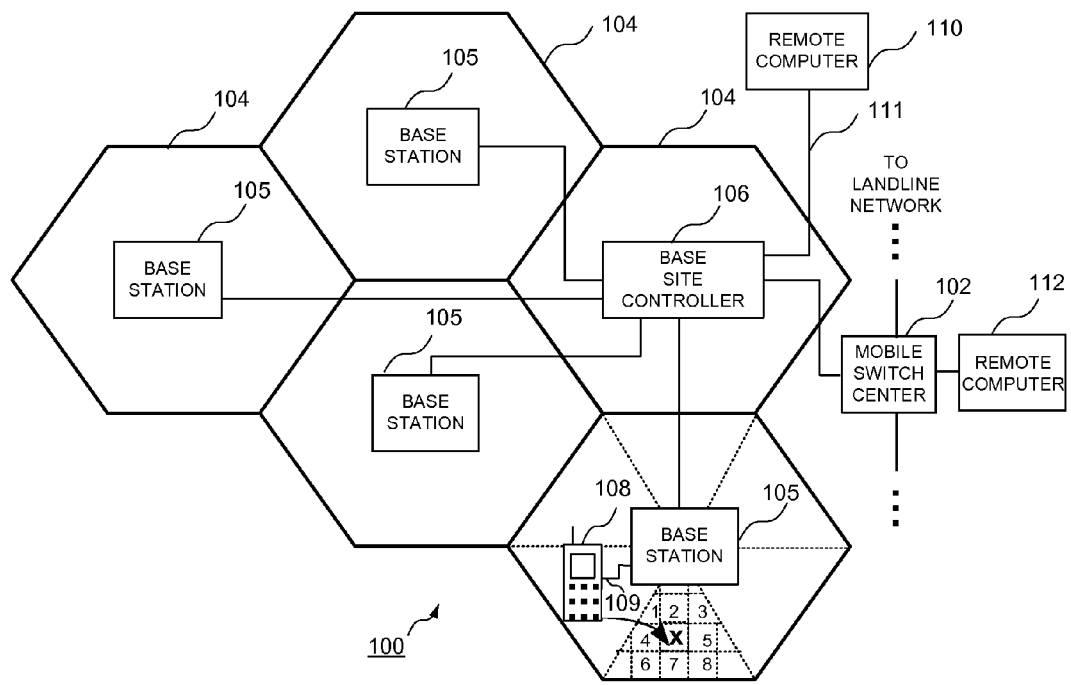
FIG. 1 is a block diagram of a communication network.

Turning first to FIG. 1, a block diagram of a wireless communication network 100 is shown. Wireless communication network 100 preferably includes a mobile switching center 102, a plurality of cell sites 104 each having a base station 105 coupled to a base site controller 106. The base site controller preferably comprises a base station 105. A wireless communication device 108 is adapted to communicate with base stations 105 associated with base site controller 106 by way of wireless communication channels 109. The base site controller 106 maintains communications between the wireless communication device 108 and another wireless communication device in the wireless communication network or a wireline unit via a landline network. Finally, another communication channel 111 enable communication between a base station and a remote computer.

The wireless communication network of FIG. 1 enables cloud-based base station processing, or a Cloud Radio Access Network ('Cloud-RAN' or simply 'C-RAN'). The wireless communication network of FIG. 1 enables digital compensation of RF non-linearities, and in particular digital pre-distortion (DPD) of non-linear RF power amplifiers that are used in the wireless downlink (i.e. a wireless signal from the base station 105 to the wireless communication device 108). Digital pre-distortion alters the signal provided to the power amplifier such that the output of the power amplifier is the desired signal. That is, the non-linearity introduced by the power amplifier alters the intentionally distorted input signal based upon predetermined parameters in such a way that the output of the power amplifier is the correct signal. Digital pre-distortion that is currently performed in a base station of the wireless communication network is moved to a remote computer 110, providing a cost advantage for the base station, and a cost advantage for the wireless communication network as a whole due to the dynamic load balancing that is possible by moving from a distributed to a centralized computing architecture, as will be described in more detail below. The arrangement of FIG. 1 also provides additional flexibility for the network operator by permitting the dynamic allocation and reallocation of centralized computing resources (i.e. the remote computer 110) between the field deployed base stations. The wireless communication network 100 of the present invention is merely one example of a wireless communication network. It will be understood that other configurations of a wireless communication network could employ the methods and circuits of the present invention. For example, a remote computer 112 could be coupled to the mobile switch center 102, in place of or in addition to the remote computer 110.

Figure 2:
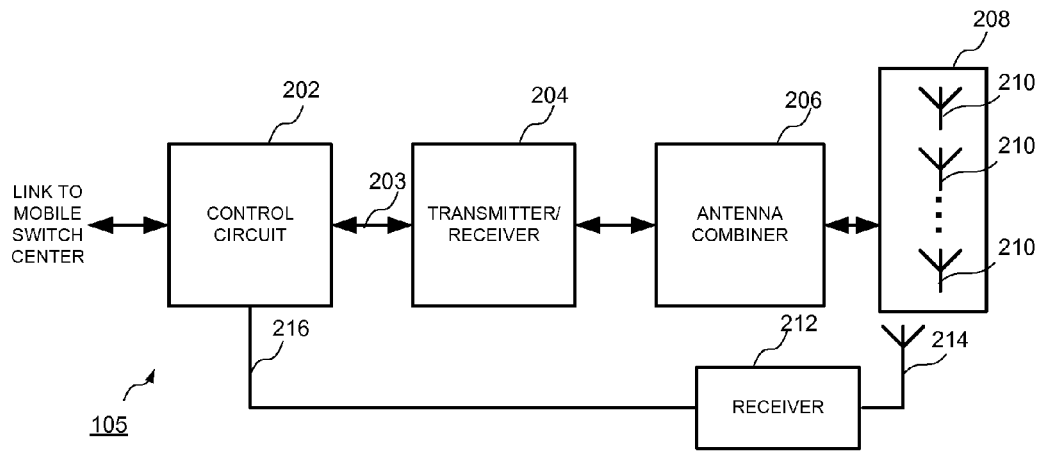
FIG. 2 is a block diagram of a base station of the communication network of FIG. 1.

Turning now to FIG. 2, a block diagram of a base station 105 of the communication network is shown. In particular, a control circuit 202 linked to the mobile switch center 102 controls a transceiver circuit 204 having a transmitter and a receiver. An antenna combiner 206 is coupled to an antenna array 208 having a plurality of antenna elements 210. The base station also includes a separate receiver 212 coupled to an antenna 214 to receive location information. As will be described in more detail in reference to their remaining figures, the control circuit 202 will control the antenna array 208 to optimize the signal transmitted to or received from the wireless communication device 108 in the wireless communication network 100. A transceiver of the base station communicates signals to the wireless communication device 108 by way of the wireless communication channel 109. The base site controller 106 communicates signals (such as data sampled by a transmitter of a base station) to the remote computer, and receives signals (such as parameters for performing digital pre-distortion generated by the remote computer) by way of the communication channel 111. The communication channel 111 could be a wired or wireless channel. Although various elements of the present invention are shown as a part of the base station 105, the elements could also be located or incorporated in other portions of the wireless communication network.

Figure 3:
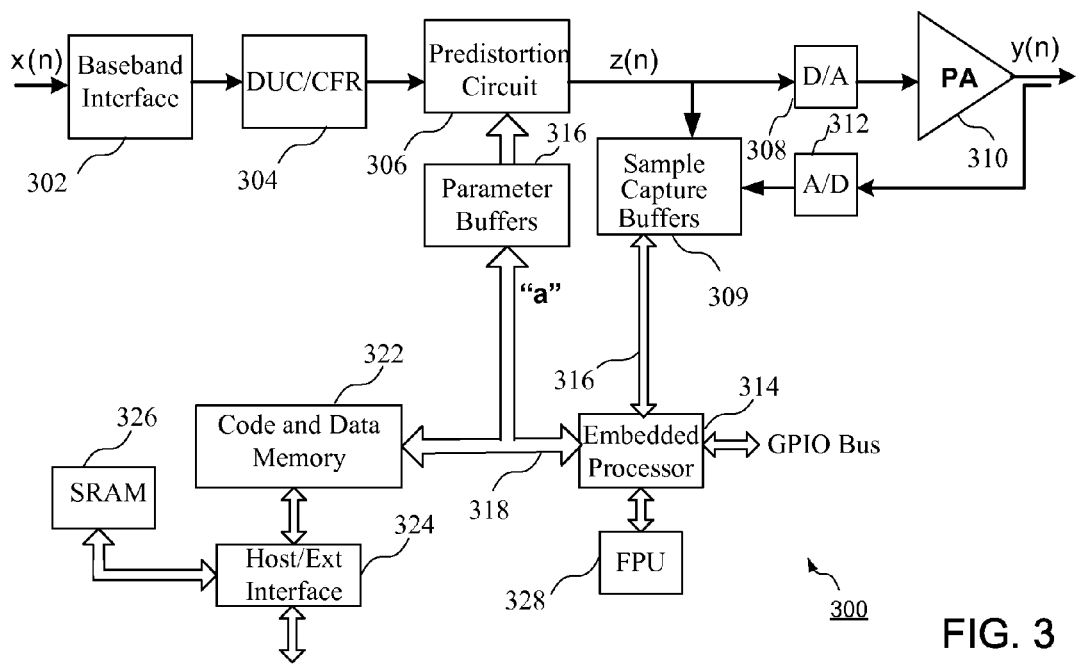
FIG. 3 is a block diagram of a transmitter circuit of the communication network of FIG. 1.

Turning now to FIG. 3, a block diagram of a transmitter circuit 300, such as a transmitter of a transceiver 204, of the communication network is shown. Alternatively, the transmitter circuit 300 could be implemented in the wireless communication device 108. In particular, the transmitter circuit 300 comprises a baseband interface 302 coupled to receive an input signal x(n), the output of which is coupled to a digital up-conversion/crest factor reduction (DUC/CFR) circuit 304. The DUC/CFR circuit 304 converts the input signal to the appropriate digital format, while crest factor reduction helps to reduce the peak-to-peak average power ratio, as is well known in the art. For example, a base band signal may be converted to an intermediate frequency (IF) signal. The output of the DUC/CFR circuit 304 is applied to the pre-distortion circuit 306, the output of which is coupled to both a digital-to-analog (D/A) converter 308 and sample capture buffers 309. The sample capture buffers also receive an output from an analog-to-digital (A/D) converter 312. The D/A circuit 308 generates radio frequency (RF) signals, while the A/D circuit 312 receives RF signals generated by the power amplifier 310.

As will be described in more detail below, an embedded processor 314 controls the sample capture buffers to ensure that the correct parameters are provided to the predistortion circuit in real time. For example, the embedded processor ensures that the received samples are brought into alignment with the transmitted samples with respect to frequency, time and amplitude. In addition to the amplitude of the signals being aligned, any delay between the two signals will be eliminated to ensure that they are aligned in time. That is, because of the time required to pass through the power amplifier will cause the signals to be out of alignment, it is necessary to adjust the alignment of the signals coupled to the sample capture buffers 309. Finally, the delay aligned signal may be offset in frequency to ensure that the frequencies of the signal are the same. This processing may be a part of a set of functions in the software running on the embedded processor. The processing may be done in real time as they are received, or after they are stored.

The embedded processor 314 may be coupled to a plurality of buses. For example, a first bus 316 may be used to transfer data between the sample capture buffers 309 and the embedded processor 314. A separate bus 318 may be used to couple data between the embedded processor and a code and data memory 322. While a single bus may be used, one benefit of using multiple buses is that the data may be transferred at different data rates. For example, the data from a sample capture buffers may take additional clock cycles to be received because they are received from the programmable logic, while the data from the code and data memory 322 may be accessed directly by the embedded processor. Other circuits, such as a floating point unit (FPU) 328, may be coupled to the embedded processor. Similarly, a host/external interface 324 and a separate SRAM 326 may be used to provide data to the code and data memory 322. The code and data memory 322 may contain any necessary computer code or data required to implement the predistortion circuit using the embedded processor. A general purpose input/output (GPIO) bus may be used to enable the data captured by the sample capture buffers 309 to be provided to a remote computer which update the parameters.

The digital pre-distortion arrangement of FIG. 3 can be factored into two major sections, one is the datapath including the pre-distortion circuit 306 that is processing the transmission waveform in preparation for delivery via the DAC 308 to the RF power amplifier 310. The other section is the adaptive portion, implemented for example by the processor 314 that is updating parameters to be used in the pre-distorter datapath. While the datapath has a real-time deadline in which to process the IQ samples of the baseband waveform, the adaption process has a much softer deadline to update parameters. For example, it may be acceptable to update the digital pre-distortion parameters at the rate of ~300 milliseconds (ms) per antenna.

Accordingly, the wireless network of FIG. 1 partitions the digital pre-distortion such that the application of parameters in a real-time digital pre-distortion datapath remains in a field-deployed unit, such as the transceiver of the base station, but the non-real time processing, such as updating parameters for performing digital pre-distortion, is implemented in a remote computer.

It should be noted that the transport delay of the sampled data to the remote computer is insignificant and does not impact the linearization performance of the transmitter. For example, if a line rate of 6 Gbps is assumed between the transmitter of the base station and the remote computer, a buffer of a typical value of 4096 samples from the base station is delivered to the remote computer in approximately 680 nanoseconds (ns). 64 such sample frames might be required to compute updated parameters, so 44 microseconds, which is an extremely small amount of time in the context of the 300 milliseconds (ms) required to update parameters as mentioned above. The centralized computing resource of the remote computer may implement the adaptive parameter update using, for example, a least squares approach, although other approaches are possible.

Figure 4:
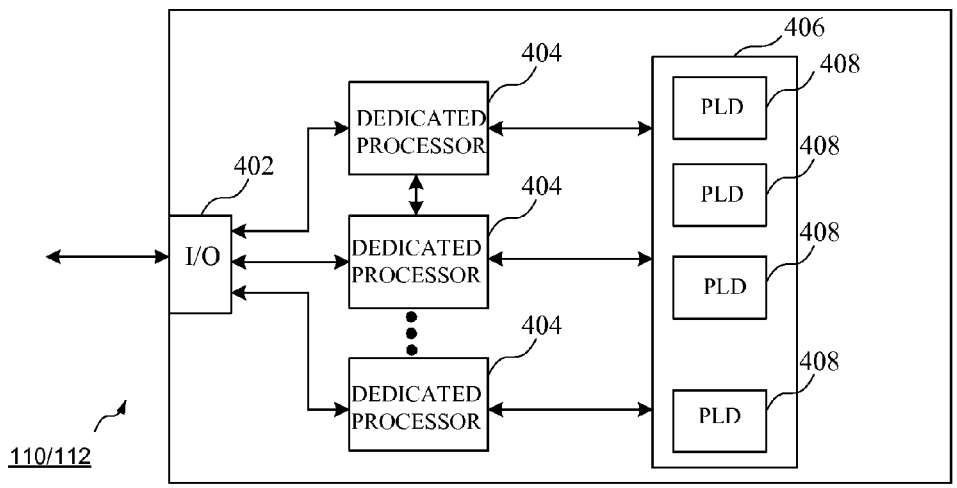
FIG. 4 is a block diagram of a remote computer of the communication network of FIG. 1.

Turning now to FIG. 4, a block diagram of a remote computer, such as remote computer 110 or 112 of the communication network of FIG. 1, is shown. An input/output (I/O) port 402 is coupled to a base site controller or mobile switching center as shown in FIG. 1, and receives data, such as the output of the pre-distortion circuit and the output of the A/D converter 312 captured by the sample capture buffers as described above for enabling the generation of updated parameters. The I/O port is coupled to a plurality of dedicated processors 404. The dedicated processors are coupled to a bank 406 of programmable logic devices (PLDs) 408, which enable improved computations. The PLDs 408 could be used for performing the necessary calculations for generating updated parameters. The dedicated processors could be microprocessors from Intel Corp of Santa Clara, Calif., for example, while the PLDs could be Field Programmable Gate Arrays (FPGAs) or Complex Programmable Logic Devices (CPLDs) from Xilinx, Inc. of San Jose, Calif.

Advantages of the implementation of a wireless communication network according to the systems and circuits of FIGS. 1-4 include leveraging the economies of scale afforded by the use of common processors for the adaptive pre-distortion processing, and which may be complemented by PLDs. Further, the use of a high-level programming method, such a C-based programming, enables the rapid development of digital pre-distortion update algorithms. Because the digital pre-distortion processing is relocated to a central location in a remote computer, dynamic load balancing of the computing resources between all of the base stations to be serviced by the remote computer is possible, as will be described in the flow chart of FIG. 10. In the distributed model, each base station must be provisioned for the worst-case processing load. For example, if carrier configurations are modified at a base station that might permit the use of a lower-complexity digital pre-distortion update to be utilized, there is no advantage to be achieved at the base station. In contrast, in the approach of FIG. 1, the resources can be directed to where they are required at a particular time, thereby cost optimizing the processing resources throughout the network. Further, a network operator can take advantage of new processing capabilities by upgrading data-center style processing blades as new processors are available. Such an upgrade is centralized and does not require retrofitting of field-deployed base stations. Therefore, the base stations automatically benefits from the upgrade of the remote computer of a central facility.

Figure 5:
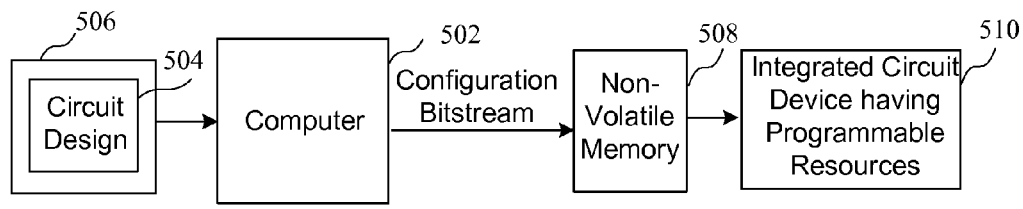
FIG. 5 is a block diagram of a system for programming a device having programmable resources according to an embodiment is shown.

Turning now to FIG. 5, a block diagram of a system for programming a device having programmable resources according to an embodiment is shown. In particular, a computer 502 is coupled to receive a circuit design 504 from a memory 506, and generate a configuration bitstream which is stored in the non-volatile memory 508. As will be described in more detail below, the circuit design may be a high level design, such as a circuit design defined in a hardware description language (HDL). Also, the computer may be configured to run software that generates a configuration bitstream which is stored in the non-volatile memory 508 and provided to an integrated circuit 510 which may be a programmable integrated circuit, such as the integrated circuit described below in FIG. 6.

The software flow for a circuit design to be implemented in a programmable integrated circuit comprises synthesis, packing, placement and routing, as is well known in the art. Synthesis comprises the step of converting a circuit design in a high level design to a configuration of elements found in the programmable integrated circuit. For example, a synthesis tool operated by the computer 502 may implement the portions of a circuit design implementing certain functions in configurable logic blocks (CLBs) or digital signal processing (DSP) blocks, for example. An example of a synthesis tool is the ISE tool available from Xilinx, Inc. of San Jose Calif. Packing comprises the step of grouping portions of the circuit design into defined blocks of the device, such as CLBs. Placing comprises the step of determining the location of the blocks of the device defined during the packing step. Finally, routing comprises selecting paths of interconnect elements, such as programmable interconnects, in a programmable integrated circuit. At the end of place and route, all functions, positions and connections are known, and a configuration bitstream is then created. The bitstream may be created by a software module called BitGen, available from Xilinx, Inc. of San Jose, Calif. The bitstream is either downloaded by way of a cable or programmed into an EPROM for delivery to the programmable integrated circuit.

Figure 6:
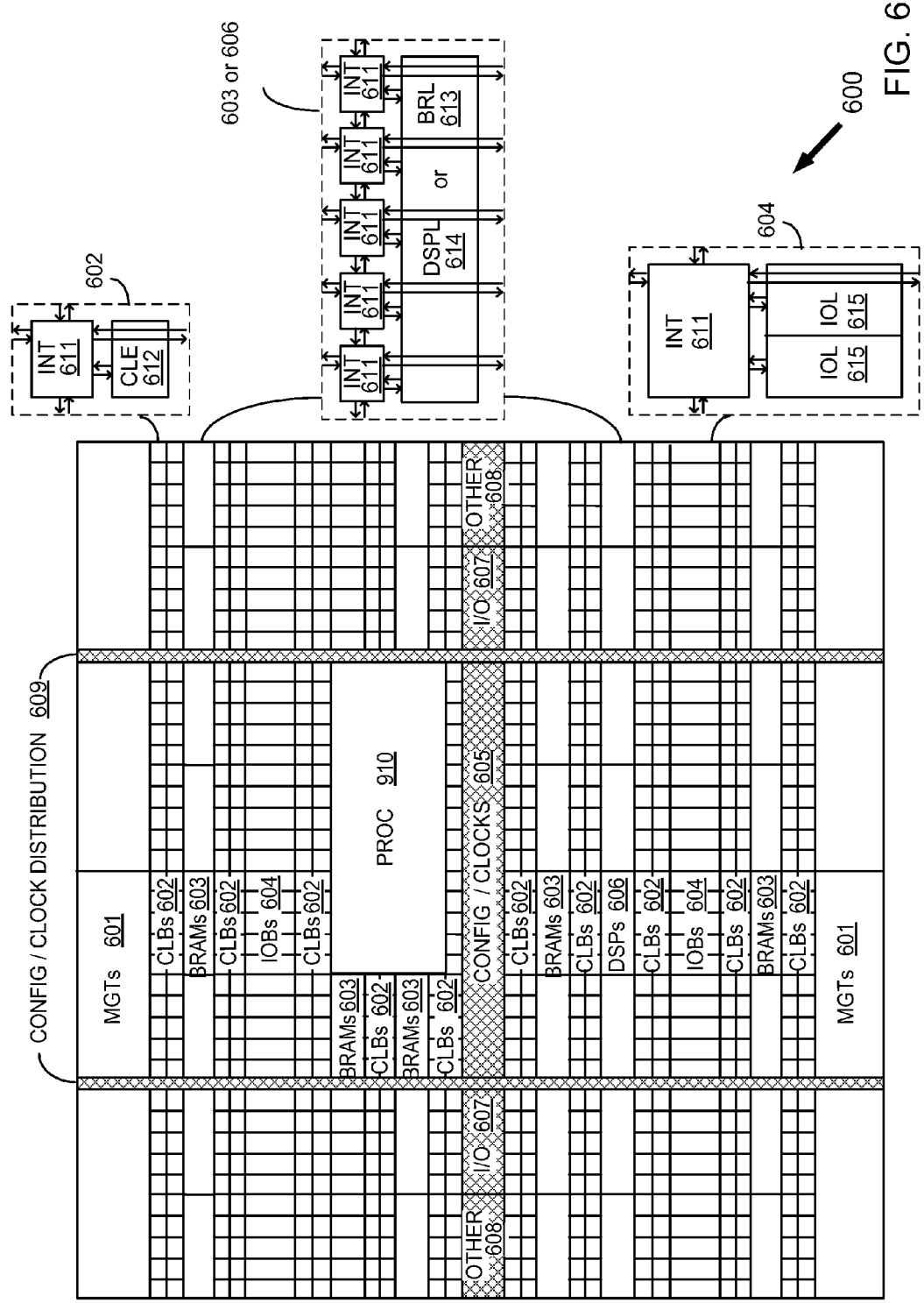
FIG. 6 is a block diagram of an integrated circuit having programmable resources.

Turning now to FIG. 6, a block diagram of an integrated circuit having programmable resources is shown. While devices having programmable resources may be implemented in any type of integrated circuit device, such as an application specific integrated circuit (ASIC) having programmable resources, other devices comprise dedicated programmable logic devices (PLDs). One type of PLD is the Complex Programmable Logic Device (CPLD). A CPLD includes two or more "function blocks" connected together and to input/output (I/O) resources by an interconnect switch matrix. Each function block of the CPLD includes a two-level AND/OR structure similar to that used in a Programmable Logic Array (PLA) or a Programmable Array Logic (PAL) device. Another type of PLD is a field programmable gate array (FPGA). In a typical FPGA, an array of configurable logic blocks (CLBs) is coupled to programmable input/output blocks (IOBs). The CLBs and IOBs are interconnected by a hierarchy of programmable routing resources. These CLBs, IOBs, and programmable routing resources are customized by loading a configuration bitstream, typically from off-chip memory, into configuration memory cells of the FPGA. For both of these types of programmable logic devices, the functionality of the device is controlled by configuration data bits of a configuration bitstream provided to the device for that purpose. The configuration data bits may be stored in volatile memory (e.g., static memory cells, as in FPGAs and some CPLDs), in non-volatile memory (e.g., Flash memory, as in some CPLDs), or in any other type of memory cell.

The device of FIG. 6 comprises an FPGA architecture 600 having a large number of different programmable tiles including multi-gigabit transceivers (MGTs) 601, CLBs 602, random access memory blocks (BRAMs) 603, input/output blocks (IOBs) 604, configuration and clocking logic (CONFIG/CLOCKS) 605, digital signal processing blocks (DSPs) 606, specialized input/output blocks (I/O) 607 (e.g., configuration ports and clock ports), and other programmable logic 608 such as digital clock managers, analog-to-digital converters, system monitoring logic, and so forth. Some FPGAs also include dedicated processor blocks (PROC) 610, which may be used to implement a software application, for example.

In some FPGAs, each programmable tile includes a programmable interconnect element (INT) 611 having standardized connections to and from a corresponding interconnect element in each adjacent tile. Therefore, the programmable interconnect elements taken together implement the programmable interconnect structure for the illustrated FPGA. The programmable interconnect element 611 also includes the connections to and from the programmable logic element within the same tile, as shown by the examples included at the top of FIG. 6.

For example, a CLB 602 may include a configurable logic element (CLE) 612 that may be programmed to implement user logic plus a single programmable interconnect element 611. A BRAM 603 may include a BRAM logic element (BRL) 613 in addition to one or more programmable interconnect elements. The BRAM includes dedicated memory separate from the distributed RAM of a configuration logic block. Typically, the number of interconnect elements included in a tile depends on the height of the tile. In the pictured embodiment, a BRAM tile has the same height as five CLBs, but other numbers may also be used. A DSP tile 606 may include a DSP logic element (DSPL) 614 in addition to an appropriate number of programmable interconnect elements. An IOB 604 may include, for example, two instances of an input/output logic element (IOL) 615 in addition to one instance of the programmable interconnect element 611. The location of connections of the device is controlled by configuration data bits of a configuration bitstream provided to the device for that purpose. The programmable interconnects, in response to bits of a configuration bitstream, enable connections comprising interconnect lines to be used to couple the various signals to the circuits implemented in programmable logic, or other circuits such as BRAMs or the processor.

In the pictured embodiment, a columnar area near the center of the die is used for configuration, clock, and other control logic. The config/clock distribution regions 609 extending from this column are used to distribute the clocks and configuration signals across the breadth of the FPGA. Some FPGAs utilizing the architecture illustrated in FIG. 6 include additional logic blocks that disrupt the regular columnar structure making up a large part of the FPGA. The additional logic blocks may be programmable blocks and/or dedicated logic. For example, the processor block PROC 610 shown in FIG. 6 spans several columns of CLBs and BRAMs.

Figure 9:
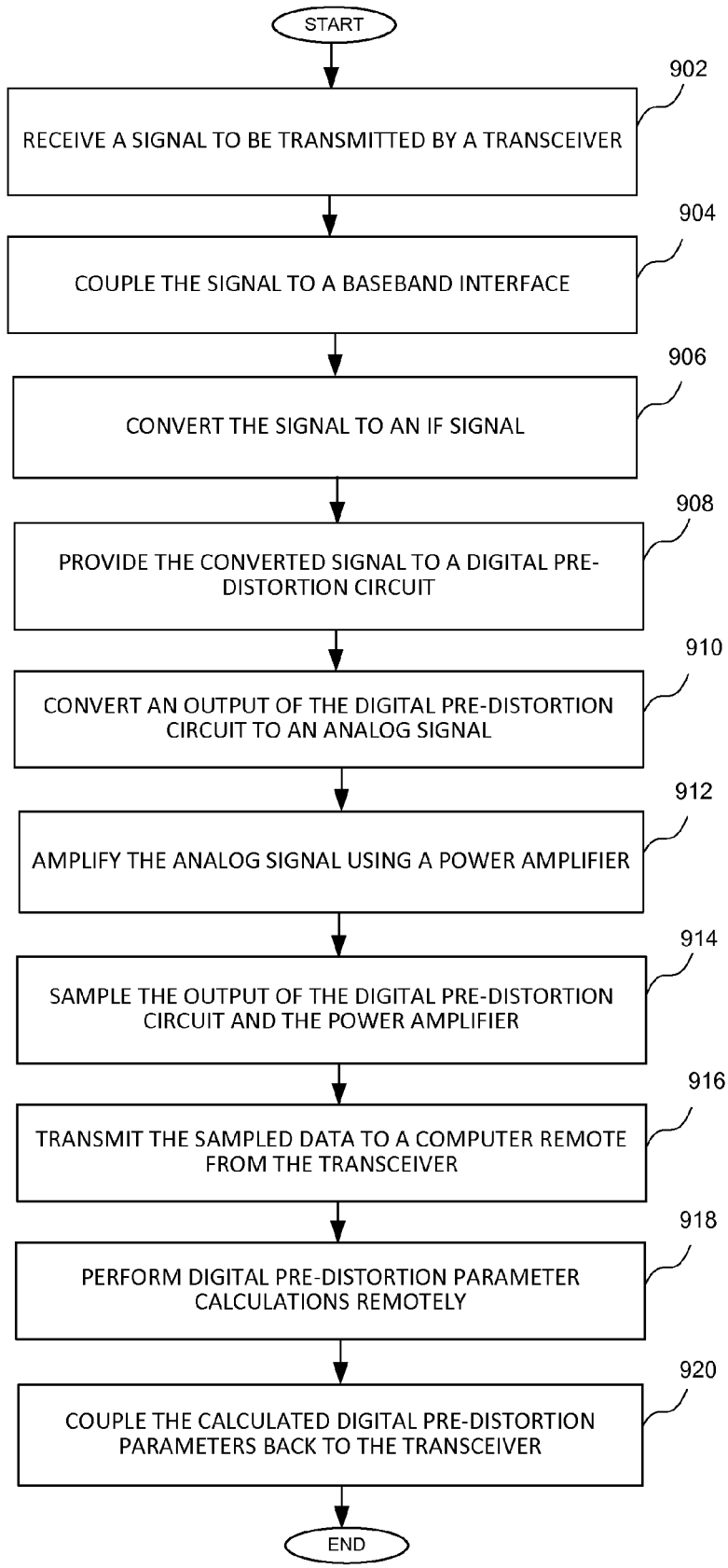
FIG. 9 is a flow chart showing a detailed method of performing digital pre-distortion in a communication network.

Note that FIG. 9 is intended to illustrate only an exemplary FPGA architecture. The numbers of logic blocks in a column, the relative widths of the columns, the number and order of columns, the types of logic blocks included in the columns, the relative sizes of the logic blocks, and the interconnect/logic implementations included at the top of FIG. 6 are purely exemplary. For example, in an actual FPGA more than one adjacent column of CLBs is typically included wherever the CLBs appear in order to facilitate the efficient implementation of user logic.

Figure 7:
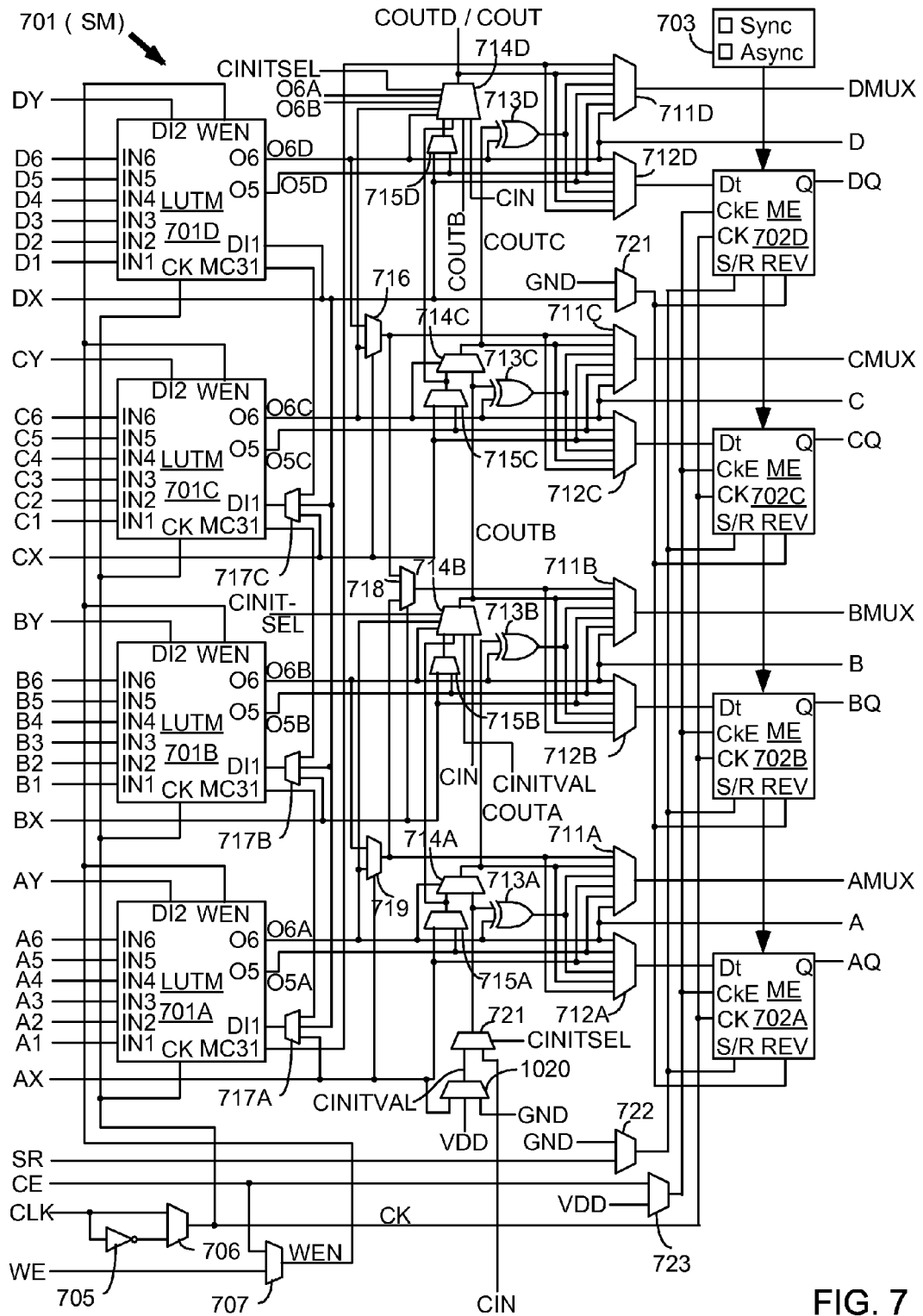
FIG. 7 is a block diagram of a configurable logic element of the integrated circuit of FIG. 6.

Turning now to FIG. 7, a block diagram of a configurable logic element of the integrated circuit of FIG. 7 is shown. In particular, FIG. 7 illustrates in simplified form a configurable logic element of a configuration logic block 602 of FIG. 6 In the embodiment of FIG. 7, slice M 701 includes four lookup tables (LUTMs) 701A-701D, each driven by six LUT data input terminals A1-A6, B1-B6, C1-C6, and D1-D6 and each providing two LUT output signals O5 and O6. The O6 output terminals from LUTs 701A-701D drive slice output terminals A-D, respectively. The LUT data input signals are supplied by the FPGA interconnect structure via input multiplexers, which may be implemented by programmable interconnect element 711, and the LUT output signals are also supplied to the interconnect structure. Slice M also includes: output select multiplexers 711A-711D driving output terminals AMUX-DMUX; multiplexers 712A-712D driving the data input terminals of memory elements 702A-702D; combinational multiplexers 716, 718, and 719; bounce multiplexer circuits 722-723; a circuit represented by inverter 705 and multiplexer 706 (which together provide an optional inversion on the input clock path); and carry logic having multiplexers 714A-714D, 715A-715D, 720-721 and exclusive OR gates 713A-713D. All of these elements are coupled together as shown in FIG. 7. Where select inputs are not shown for the multiplexers illustrated in FIG. 7, the select inputs are controlled by configuration memory cells. That is, configuration bits of the configuration bitstream stored in configuration memory cells are coupled to the select inputs of the multiplexers to select the correct inputs to the multiplexers. These configuration memory cells, which are well known, are omitted from FIG. 7 for clarity, as well as from other selected figures herein.

In the pictured embodiment, each memory element 702A-702D may be programmed to function as a synchronous or asynchronous flip-flop or latch. The selection between synchronous and asynchronous functionality is made for all four memory elements in a slice by programming Sync/Asynch selection circuit 703. When a memory element is programmed so that the S/R (set/reset) input signal provides a set function, the REV input terminal provides the reset function. When the memory element is programmed so that the S/R input signal provides a reset function, the REV input terminal provides the set function. Memory elements 702A-702D are clocked by a clock signal CK, which may be provided by a global clock network or by the interconnect structure, for example. Such programmable memory elements are well known in the art of FPGA design. Each memory element 702A-702D provides a registered output signal AQ-DQ to the interconnect structure. Because each LUT 701A-701D provides two output signals, O5 and O6, the LUT may be configured to function as two 5-input LUTs with five shared input signals (IN1-IN5), or as one 6-input LUT having input signals IN1-IN6.

In the embodiment of FIG. 7, each LUTM 701A-701D may function in any of several modes. When in lookup table mode, each LUT has six data input signals IN1-IN6 that are supplied by the FPGA interconnect structure via input multiplexers. One of 64 data values is programmably selected from configuration memory cells based on the values of signals IN1-IN6. When in RAM mode, each LUT functions as a single 64-bit RAM or two 32-bit RAMs with shared addressing. The RAM write data is supplied to the 64-bit RAM via input terminal DI1 (via multiplexers 717A-717C for LUTs 701A-701C), or to the two 32-bit RAMs via input terminals DI1 and DI2. RAM write operations in the LUT RAMs are controlled by clock signal CK from multiplexer 706 and by write enable signal WEN from multiplexer 707, which may selectively pass either the clock enable signal CE or the write enable signal WE. In shift register mode, each LUT functions as two 16-bit shift registers, or with the two 16-bit shift registers coupled in series to create a single 32-bit shift register. The shift-in signals are provided via one or both of input terminals DI1 and DI2. The 16-bit and 32-bit shift out signals may be provided through the LUT output terminals, and the 32-bit shift out signal may also be provided more directly via LUT output terminal MC31. The 32-bit shift out signal MC31 of LUT 701A may also be provided to the general interconnect structure for shift register chaining, via output select multiplexer 711D and CLE output terminal DMUX. Accordingly, the circuits and methods set forth above may be implemented in a device such as the devices of FIGS. 6 and 7, or any other suitable device.

Figure 8:
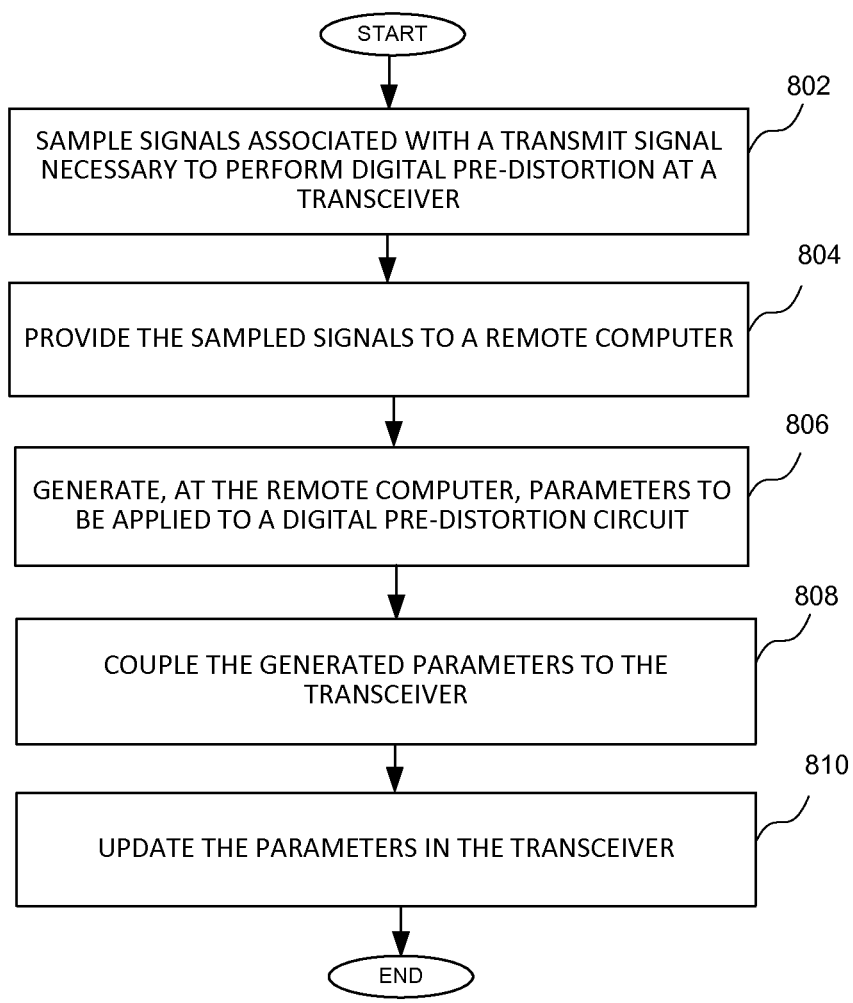
FIG. 8 is a flow chart showing a method of performing digital pre-distortion in a communication network.

Various methods for implementing a wireless communication network are now described. The methods may be implemented according to the systems and circuits of FIGS. 1-7 as described, or other suitable systems and circuits. Turning first to FIG. 8, a flow chart shows a method of performing digital pre-distortion in a communication network. In particular, signals associated with a transmit signal necessary to perform digital pre-distortion are sampled at a block 802. The sampled signals are provided to a remote computer at a block 804. Parameters to be applied to a digital pre-distortion circuit are generated, at the remote computer, at a block 806. The generated parameters are coupled to the transceiver at a block 808. The parameters are updated in the transceiver at a block 810.

Turning now to FIG. 9, a flow chart shows a detailed method of performing digital pre-distortion in a communication network. A signal to be transmitted by a transceiver is received at a block 902. The signal is coupled to a baseband interface at a block 904. The signal is converted to an IF signal at a block 906. The converted signal is provided to a digital pre-distortion circuit at a block 908. An output of the digital pre-distortion circuit is converted to an analog signal at a block 910. The analog signal is amplified using a power amplifier at a block 912. The outputs of the digital pre-distortion circuit and the power amplifier are sampled at a block 914. The sampled data is transmitted to a computer remote from the transceiver at a block 916. Digital pre-distortion parameter calculations are performed remotely at a block 918. The calculated digital pre-distortion parameters are coupled back to the transceiver at a block 920. While the circuits and methods find particular application in transceivers of base stations of a wireless communication network, the circuits and methods could be implemented with transceivers of portable wireless communication device, where the sampled data is transmitted from the portable wireless communication device by way of a base station to the remote computer, and calculated digital pre-distortion parameters are coupled back to the transceiver by way of the base station.

Figure 10:
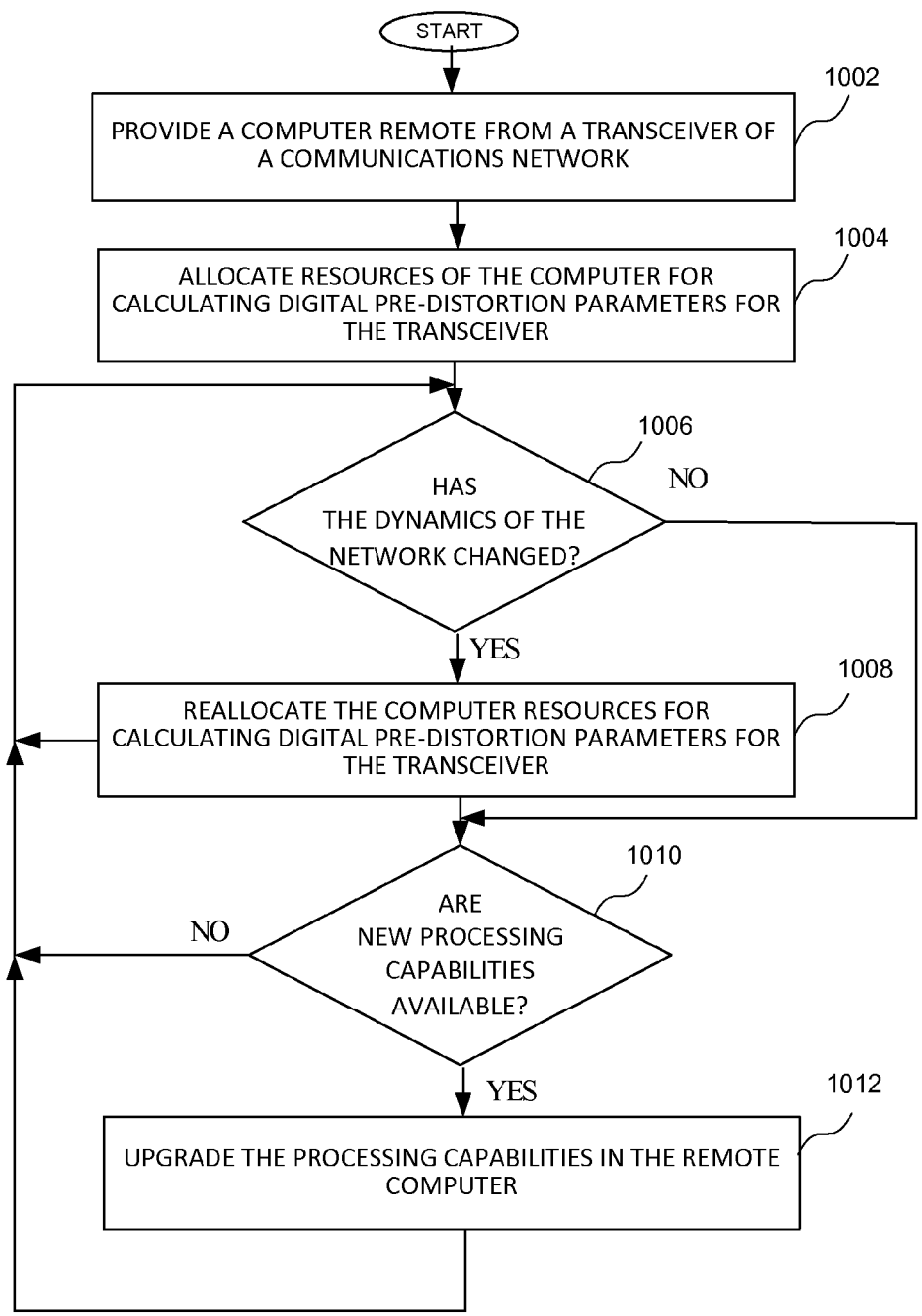
FIG. 10 is a flow chart showing a method of implementing a remote computer a communication network.

Turning now to FIG. 10, a flow chart showing a method of implementing a remote computer in a communication network. A computer remote from a transmitter of a communications network is provided at a block 1002. Resources of the remote computer for calculating digital pre-distortion parameters for the transmitter are allocated at a block 1002 1004. It is then determined whether the dynamics of the network has changed at a block 1006. If so, the resources for calculating digital pre-distortion parameters for the transceiver at the remote computer are reallocated at a block 1008. Otherwise, it is then determined whether new processing capabilities available at a block 1010. If so, the processing capabilities in the computer network are upgraded at a block 1012. Otherwise, it continued to determine whether the dynamics of the network has changed at the block 1006.

It can therefore be appreciated that the new and novel communication network and method of performing digital pre-distortion in a communication network has been described. It will be appreciated by those skilled in the art that numerous alternatives and equivalents will be seen to exist which incorporate the disclosed invention. As a result, the invention is not to be limited by the foregoing embodiments, but only by the following claims.

What is claimed is:

1. A method of performing digital pre-distortion in a communication network, the method comprising:
coupling a plurality of base stations to a remote computer in the communication network, wherein each base station of the plurality of base stations has a transceiver;
enabling digital pre-distortion processing at a central location for the plurality of base stations by updating parameters for performing digital pre-distortion for each of the plurality of base stations at the remote computer;
implementing a transceiver at a base station of the plurality of base stations in the communication network, the transceiver having a pre-distortion circuit and a power amplifier and enabling the transfer of communication signals in the communication network by way of a wireless communication channel;
sampling signals, at the pre-distortion circuit of the transceiver, associated with a transmit signal which are necessary to perform digital pre-distortion;
providing the sampled signals to the remote computer; and
generating, at the remote computer, parameters to be applied to a digital pre-distortion circuit of the transceiver.

2. The method of claim 1 further comprising coupling the generated parameters to the transceiver.

3. The method of claim 2 further comprising updating parameters stored in the transceiver.

4. The method of claim 1 wherein providing the sampled signals to the remote computer comprises providing the sampled signals by way of a second communication channel.

5. The method of claim 1 further comprising determining, by the transceiver, the appropriate parameters to apply to the digital pre-distortion circuit.

6. The method of claim 1 further comprising allocating resources of the remote computer to generate, for each transceiver of the plurality of transceivers, parameters to be applied to the transceiver.

7. The method of claim 1 wherein the remote computer comprises a plurality of programmable logic devices, the method further comprising updating the configurations of the plurality of programmable logic devices to generate the parameters to be applied to the digital pre-distortion circuit of the transceiver.

8. The method of claim 1 wherein each transceiver enables the transfer of communication signals in the communication network by way of a wireless communication channel and sampling signals comprises sampling, for each transceiver, signals associated with a transmit signal which are necessary to perform digital pre-distortion.

9. The method of claim 8 wherein providing the sampled signals to the remote computer comprises providing, for each transceiver, the sampled signals to a remote computer.

10. The method of claim 9 wherein generating, at the remote computer, parameters comprises generating, for each transceiver, updated parameters for performing digital pre-distortion.

11. A communication network, comprising:
a plurality of base stations, wherein each base of the plurality of base stations has a transceiver; and
a remote computer coupled to the plurality of base stations, the remote computer enabling digital pre-distortion processing at a central location for the plurality of base stations by updating digital pre-distortion parameters for each of the plurality of base stations at the remote computer, wherein computing resources of the remote computer generate, for each transceiver of the plurality of transceivers, the digital pre-distortion parameters to be applied to the transceiver; and
wherein each base station of the plurality of base stations comprises:
a power amplifier at the transceiver;
a pre-distortion circuit of the transceiver coupled to the power amplifier;
a memory storing signals associated with a transmit signal and sampled at the pre-distortion circuit, wherein the sampled signals enable the calculation of digital pre-distortion parameters for signals transmitted in the communication network; and
a processing circuit coupled to the memory, the processing circuit configured to transfer the sampled signals to the remote computer for generating the digital pre-distortion parameters.

12. The communication network of claim 11 wherein the memory comprises sample capture buffers coupled to an output of a pre-distortion circuit and an output of the power amplifier.

13. The communication network of claim 11 wherein the processing circuit provides the sampled signal to the remote computer by way of a communication channel between the base station and the remote computer.

14. The communication network of claim 13 wherein the remote computer calculates the digital pre-distortion parameters based upon the sampled signals.

15. A communication device, comprising:
an input for receiving sampled signals associated with a transmit signal generated by a transceiver having a pre-distortion circuit and a power amplifier, wherein the sampled signals comprise an output of the pre-distortion circuit and an output of the power amplifier; and
a remote computer having a processing circuit coupled to the input, wherein the processing circuit is remote from the transceiver and is configured to calculate digital pre-distortion parameters to be applied to signals transmitted by the transceiver;
wherein the remote computer enables digital pre-distortion processing at a central location for a plurality of base stations by updating digital pre-distortion parameters, at the remote computer, for each base station of the plurality of base stations.

16. The communication device of claim 15 wherein the remote computer is coupled to receive the sampled signals by way of a communication channel between a base station of the plurality of base stations and the remote computer.

17. The communication device of claim 16 wherein the remote computer provides digital pre-distortion parameters to the transceiver by way of the communication channel.

18. The communication device of claim 16 wherein the remote computer comprises a plurality of programmable logic devices.

* * * * *